United States Patent
Bottos et al.

(10) Patent No.: US 6,871,657 B2
(45) Date of Patent: Mar. 29, 2005

(54) LOW PROFILE WAFER CARRIER

(75) Inventors: Jim Bottos, Phillipsburg, NJ (US); Tom Mancuso, Allentown, PA (US); Ismail Kashkoush, Orefield, PA (US)

(73) Assignee: Akrion, LLC, Allentown, PA (US)

( * ) Notice: Subject to any disclaimer, the term of this patent is extended or adjusted under 35 U.S.C. 154(b) by 89 days.

(21) Appl. No.: 10/053,449

(22) Filed: Jan. 17, 2002

(65) Prior Publication Data

US 2003/0121533 A1 Jul. 3, 2003

Related U.S. Application Data

(60) Provisional application No. 60/282,269, filed on Apr. 6, 2001.

(51) Int. Cl.[7] ............................................. B08B 3/04
(52) U.S. Cl. ................... 134/115 R; 134/135; 134/201; 134/902; 211/41.18
(58) Field of Search ............................ 134/115 R, 135, 134/201, 902; 211/41.17, 41.4, 41.8; 206/832

(56) References Cited

U.S. PATENT DOCUMENTS

| | | | | |
|---|---|---|---|---|
| 874,917 A | * | 12/1907 | Timberlake | 211/41.7 |
| 1,348,792 A | * | 8/1920 | Feingold | 211/41.4 |
| 1,952,457 A | * | 3/1934 | Painter | 280/28.18 |
| 2,841,288 A | * | 7/1958 | Field et al. | 211/41.4 |
| D192,477 S | * | 3/1962 | Chapman | |
| 3,422,959 A | * | 1/1969 | Sharaf | 211/41.4 |
| 3,610,613 A | * | 10/1971 | Worden | 269/254 R |
| 3,678,893 A | * | 7/1972 | Bell, III | 118/500 |
| 4,256,229 A | * | 3/1981 | Lee | 211/41.18 |
| 4,318,749 A | * | 3/1982 | Mayer | 134/25.4 |
| 4,350,116 A | * | 9/1982 | Grandia et al. | 118/500 |
| 4,355,974 A | * | 10/1982 | Lee | 432/253 |
| 4,569,452 A | * | 2/1986 | Schulke | 206/454 |
| 4,653,636 A | * | 3/1987 | Armstrong | 206/711 |
| 4,966,549 A | * | 10/1990 | Ohdate | 432/253 |
| 4,981,222 A | * | 1/1991 | Lee | 211/41.18 |
| 4,993,559 A | * | 2/1991 | Cota | 211/41.18 |
| 5,197,271 A | * | 3/1993 | Robbins et al. | 451/326 |
| 5,370,142 A | * | 12/1994 | Nishi et al. | 134/61 |
| 5,417,767 A | * | 5/1995 | Stinson | 118/728 |
| 5,429,251 A | * | 7/1995 | Matthews | 211/41.18 |
| 5,503,173 A | * | 4/1996 | Kudo et al. | 134/201 |
| 5,534,074 A | * | 7/1996 | Koons | 118/728 |
| 5,672,212 A | * | 9/1997 | Manos | 134/1.3 |
| D409,158 S | * | 5/1999 | Shimazu | D13/182 |
| 6,033,215 A | * | 3/2000 | Ohsawa | 432/258 |
| 6,039,187 A | * | 3/2000 | Mendiola | 206/711 |
| 6,041,938 A | * | 3/2000 | Senn | 206/711 |
| 6,056,123 A | * | 5/2000 | Niemirowski et al. | 206/711 |
| 6,092,851 A | | 7/2000 | Korn et al. | |
| 6,092,981 A | * | 7/2000 | Pfeiffer et al. | 414/810 |
| 6,099,302 A | * | 8/2000 | Hong et al. | 432/259 |
| 6,237,979 B1 | | 5/2001 | Korn et al. | |
| 6,245,147 B1 | * | 6/2001 | Kobayashi | 118/500 |
| 6,268,030 B1 | | 7/2001 | Zhang et al. | |
| 6,571,964 B2 | * | 6/2003 | Jacobson et al. | 211/41.12 |

* cited by examiner

*Primary Examiner*—Frankie L. Stinson
(74) *Attorney, Agent, or Firm*—Cozen O'Connor, P.C.; Michael B. Fein, Esq.; Brian L. Belles, Esq.

(57) ABSTRACT

An apparatus for transporting semiconductor wafers between processing steps that can also be used to support the wafers during various processing steps. The apparatus minimizes the obstruction of fluid flow in the process tank, reduces the amount of devices that will fail due to edge exclusion, and reduces processing times. In one embodiment, the apparatus is a wafer carrier comprising a wire frame having three load supporting members, the load supporting members having a plurality of wafer engaging elements adapted to support a plurality of wafers.

21 Claims, 7 Drawing Sheets

LOW PROFILE WAFER CARRIER

CROSS-REFERENCE TO RELATED APPLICATION

This Application claims the benefit of Provisional Application, 60/282,269, filed Apr. 6, 2001.

BACKGROUND OF THE INVENTION

1. Field of the Invention

The present invention relates to the fabrication of integrated circuits, and more particularly to a wafer carrier with a low profile that reduces fluid flow obstruction, decreases processing time, and increases wafer yields.

2. Description of Prior Art

Integrated circuit devices are produced on semiconductor wafers where each wafer can produce a multitude of integrated circuit devices. Two long standing goals of wafer processing are: (1) to increase the yield of properly functioning devices obtained from each wafer; and (2) to decrease wafer processing time.

In processing wafers, wafers are subjected to a multitude of different processing steps. Wafer carriers are used to transport the wafers to these different processing areas. Often, the wafers are not removed from the wafer carriers while the wafers are subjected to certain processing steps such as cleaning and drying steps. It is desirable to process wafers while in a wafer carrier not only because the wafer carrier provides support for the wafers, but also because doing so reduces handling of the wafers which can result in the undesirable outcomes of breaking and/or contaminating the wafers. It is well known in the art that contaminating a wafer will very likely reduce the yield of properly functioning devices obtained from a wafer. Thus, it is desirable to have a wafer carrier that can used to process the wafers.

While this is true, leaving wafers in a wafer carrier during processing can create a number of problems in of itself. For example, in processing wafers, it is known in the art that the presence of liquid on a wafer will decrease the yield of that wafer. However, because removing contaminants is crucial to obtaining properly functioning devices, wafers are subjected to a rinsing step. After rinsing, the liquid must be completely removed from the wafer surface or the affected devices will fail. Removal of this liquid is performed at a drying step. For the reasons stated above, the wafers are often in the same wafer carrier both during the rinsing step and the consecutive drying step. Often, despite going through the drying step, a certain amount of liquid will get trapped between the wafer and the wafer carrier at those points where the wafer contacts the wafer carrier. The greater the size of the contact area present between the wafer carrier and the wafers, the greater is the amount of liquid trapped. This trapped liquid is undesirable for two reasons. First, the area of the wafer that remains wet can not be used to make properly functioning devices. This is know in the art as edge exclusion and results in lower yields. Second, processing time will be increased because the more liquid that is trapped between the wafer carrier and the wafers, the longer it will take to substantially dry the wafers. Thus there is a need for a wafer carrier that reduces the area of contact between a wafer carrier and the wafers while still properly supporting the wafers.

Currently, there are no wafer carriers that effectively minimize the number and size of these contact points. Existing wafer carriers either have four supporting members that contact the wafers or the supporting members are designed so as to contact a substantial area of the wafers being supported thereby.

Another problem that arises in processing wafers while in a wafer carrier is that the wafer carrier can obstruct the flow of fluid over the wafer surfaces. The unobstructed flow of processing fluids over wafer surfaces is essential to efficient and effective wafer production. Depending on the particular processing step involved, obstructed fluid flow can result in contaminants not being removed from the wafer surfaces and/or increased processing times. These problems can arise in a number of processing steps, including rinsing and chemical treatment. Moreover, many of the processes necessitating fluid flow take place at elevated temperatures and in corrosive chemical environments. Thus there is a need for a wafer carrier that is as non-obstructive as possible with regard to fluid flow while remaining structurally sound during rigorous thermal cycling and chemical exposure.

Currently, plastic "wafer baskets" are used to carry and process wafers. Wafer baskets are bulky and are not fluidly dynamic. As such, these "wafer baskets" obstruct a substantial amount of fluid flow, resulting in increased processing times and/or decreased yields.

Yet another problem that arises in processing wafers in currently available wafer carriers is that the processing tanks must be large enough to accommodate not only the wafers, but also the additional size of the wafer carrier. This leads to bulkier tanks and processing equipment which is more expensive to both build and operate. Thus, there is a need for a structurally compact wafer carrier that can structurally support a plurality of wafers.

SUMMARY OF THE INVENTION

These needs and others are met by the present invention which is in one aspect a wafer carrier comprising a wire frame having three load-supporting members having wafer engaging elements. In another aspect, the invention comprises a method of processing wafers using the wafer carrier of the present invention. A still further aspect is a process tank which includes the wafer carrier of the present invention. The wafer engaging elements of the three load-supporting members are preferably parallelly aligned. The wafer engaging elements can be a plurality of saw-toothed profiles, grooves, or slots. Preferably, the wafer engaging elements are saw-toothed profiles having wafer contact edges.

Optionally, each load supporting member can have an elliptical cross section having a major thickness and a minor thickness. Each load supporting member can be oriented so that the major thickness of its elliptical cross section is aligned in the load bearing direction while the minor thickness of each load-supporting member is no more than about 0.5 inches.

Moreover, the three load supporting members can consist of a bottom support member and two side support members. Preferably, the major thickness and minor thickness of the bottom support member will be larger than the major thickness and minor thickness of the two side support members respectively, wherein the minor thickness of the bottom support member will be no more than about 0.5 inches.

Also the wafer carrier can have a width that is smaller than the diameter of the wafers being supported by the wafer carrier. Preferably the wafer carrier is chemically resistant and is adapted to withstand thermal cycling at temperatures of 1800° C. with no substantial creep deformation. The wire frame can be constructed of a fluoropolymer or can be constructed so as to have an inner core and an outer coating.

The material of the inner core can be made of a fluoropolymer or can be selected from the group consisting of ceramic, polyetherketoneketones with carbon fiber, stainless steel, and polyetheretherketones. The outer coating can be made of a fluoropolymer or can be either a suitable perfluoralkoxy or a copolymer of ethylene and chlorotrifluoroethylene. Preferably, the wafer engaging elements are molded into the outer coating.

In another embodiment, the invention comprises a method of processing wafers using the above described wafer carrier. The process tank can be a drying tank, a rinsing tank, or a chemical treatment tank.

In yet another embodiment, the invention is a process tank comprises comprising the wafer carrier described above. The process tank can be a drying tank, a rinsing tank, or a chemical treatment tank.

DETAILED DESCRIPTION OF THE INVENTION

Figure 1:
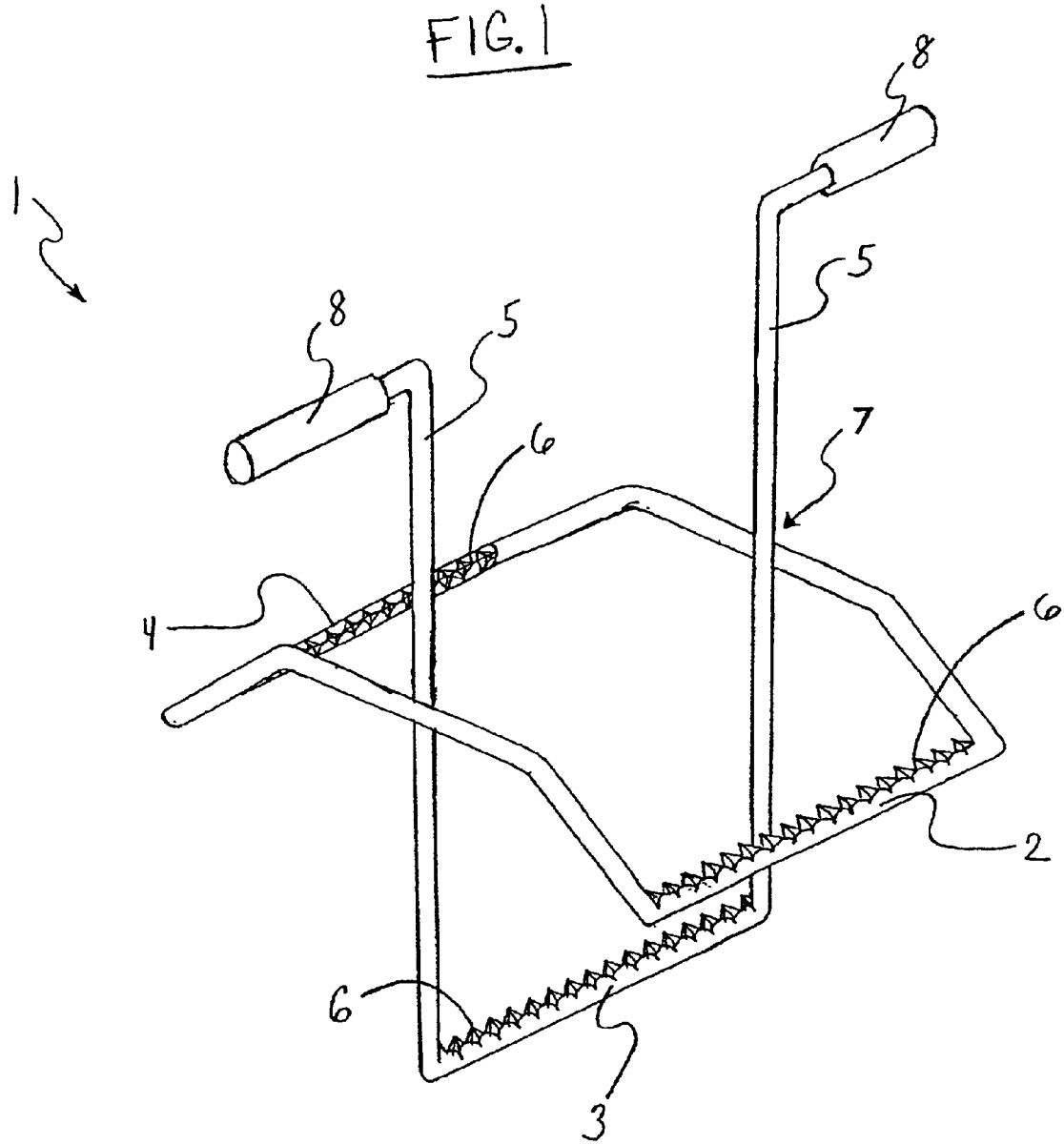
FIG. 1 is a side elevational view of an embodiment of the present invention, a low profile wafer carrier.

FIG. 1 is a side elevational view of a wafer carrier 1 made according to the present invention. Wafer carrier 1 comprises wire frame 7 having three load supporting members 2–4 and lifters 5. Lifters 5 have handles 8 attached at the end for moving wafer carrier 1. In the illustrated embodiment, the three load supporting members 2–4 consist of bottom support member 3 and two side support members 2, 4. Bottom support member 3 and the two side support members 2, 4 have a plurality of wafer engaging elements 6 connected thereto. As illustrated, wafer engaging elements 6 are saw toothed profiles. However, wafer engaging elements 6 can take on a variety of shapes such as slots or grooves.

Figure 2:
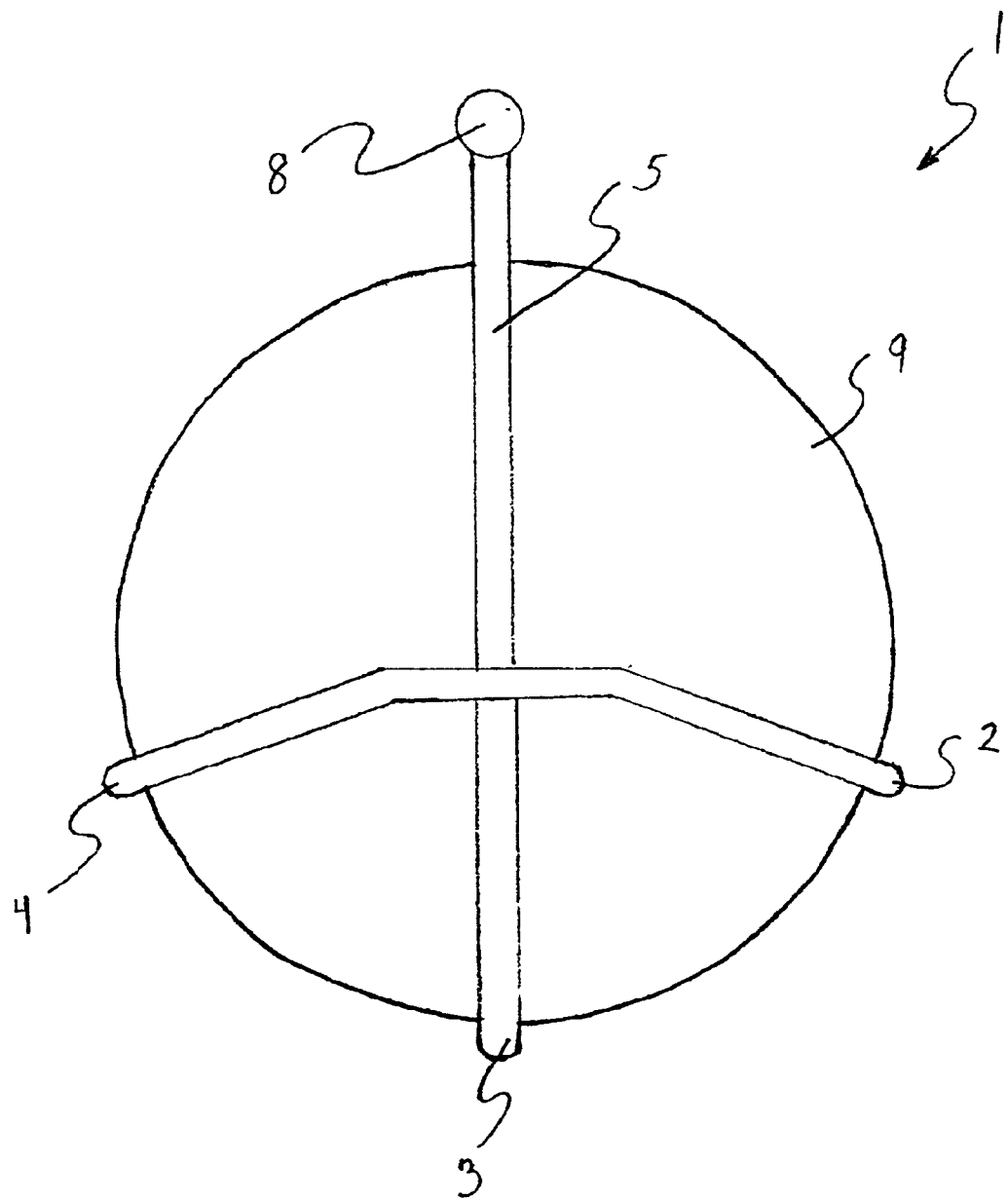
FIG. 2 is a front view of the present invention, a low profile wafer carrier, supporting a wafer.

Wafer engaging elements 6 of bottom support member 3 and the two side support members 2, 4 are positioned so that they are parallelly aligned. This parallel alignment allows wafer 9 to be inserted in wafer carrier 1 and supported by wafer engaging elements 6 in a substantially upright position (FIG. 2). Because there are a plurality of wafer engaging elements 6, a plurality of wafers 9 can be supported by wafer carrier 1 at the same time (not illustrated).

Figure 3:
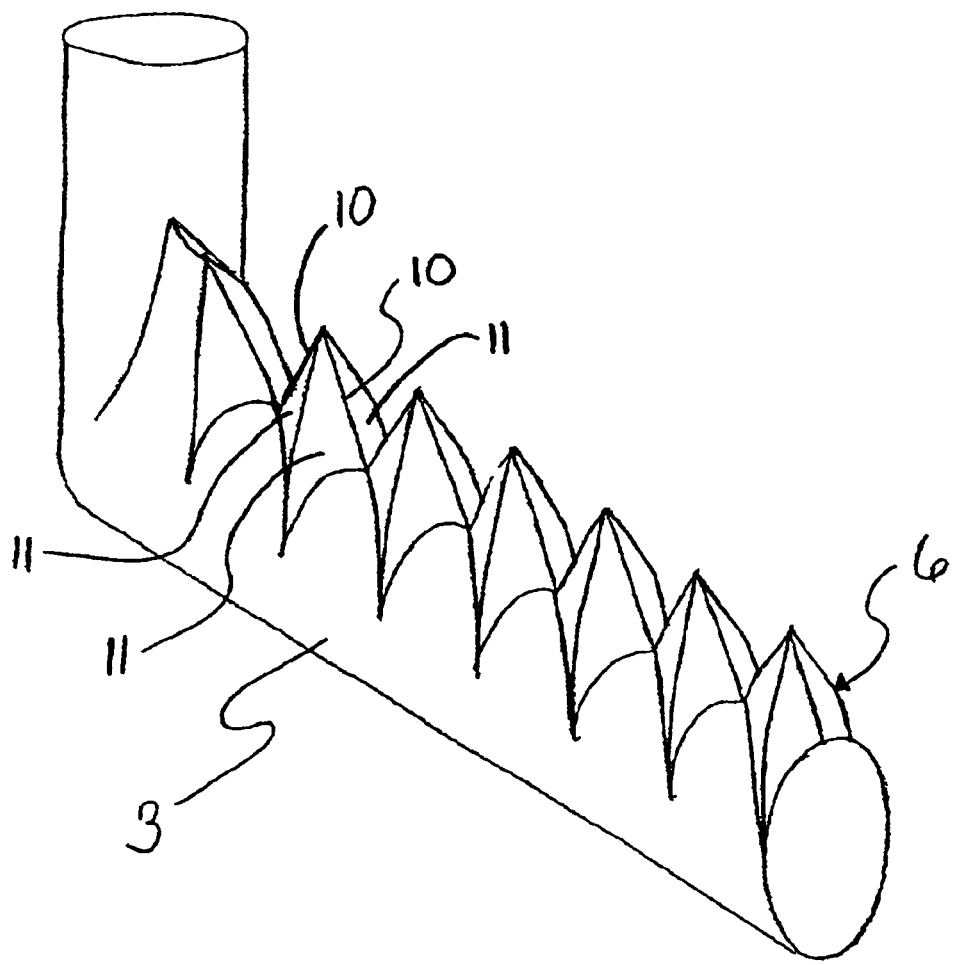
FIG. 3 is a view of a section of a load supporting member with saw-toothed profiles as wafer engaging elements.

FIG. 3 is a view of a section of bottom support member 3. In the illustration, wafer engaging elements 6 are saw toothed profiles 6. As illustrated, saw-toothed profiles 6 are shaped similar to four-sided pyramids. Each saw toothed profile 6 has wafer contacting edges 10. Wafer contacting edges 10 are lines formed by the intersection of two of the pyramid's surfaces 11 of the saw-toothed profiles 6. While FIG. 3 illustrates load supporting member 3, saw-toothed profiles 6 are constructed identically on the two side supporting members 2, 4.

Figure 4:
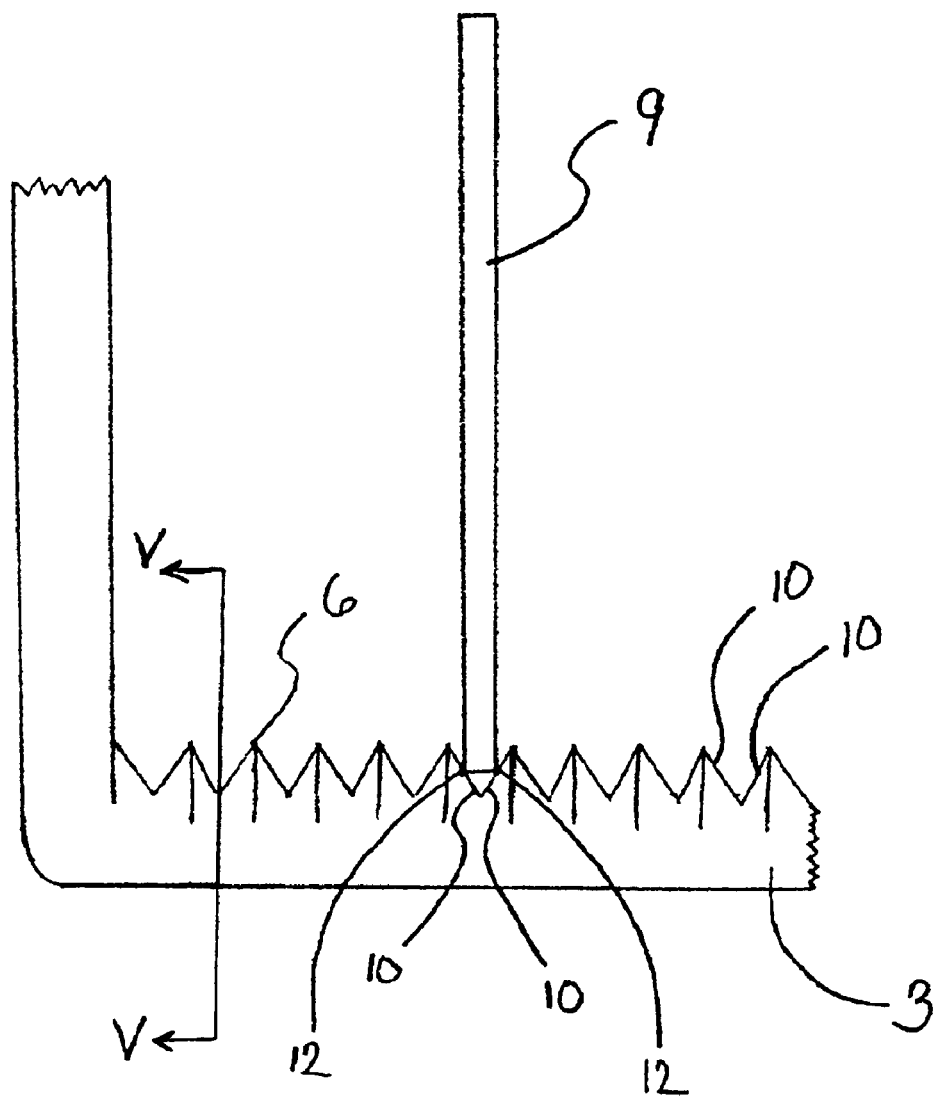
FIG. 4 is a side view of a load supporting member with a wafer supported by wafer contact edges of the saw-toothed profiles.

Referring to FIGS. 2 and 4, saw-toothed profiles 6 are positioned on bottom support member 3 so that when wafer 9 is inserted into wafer carrier 1, wafer 9 is engaged and supported by saw-toothed profiles 6 in such a manner that the only part of wafer carrier 1 that contacts wafer 9 is the wafer contact edges 10 of the saw-toothed profiles 6. As a result, there are only two contact points 12 formed between wafer 9 and bottom support member 3. While FIG. 4 illustrates how saw-toothed profile 6 are positioned on bottom support member 3, the saw-toothed profiles 6 on the two side support members 2, 4 are positioned identically and engage and support wafer 9 similarly. Thus, because there are three load supporting members 2–4, each wafer 9 supported by wafer carrier 1 has a total of exactly six contact points 12 with wafer carrier 1.

Figure 5:
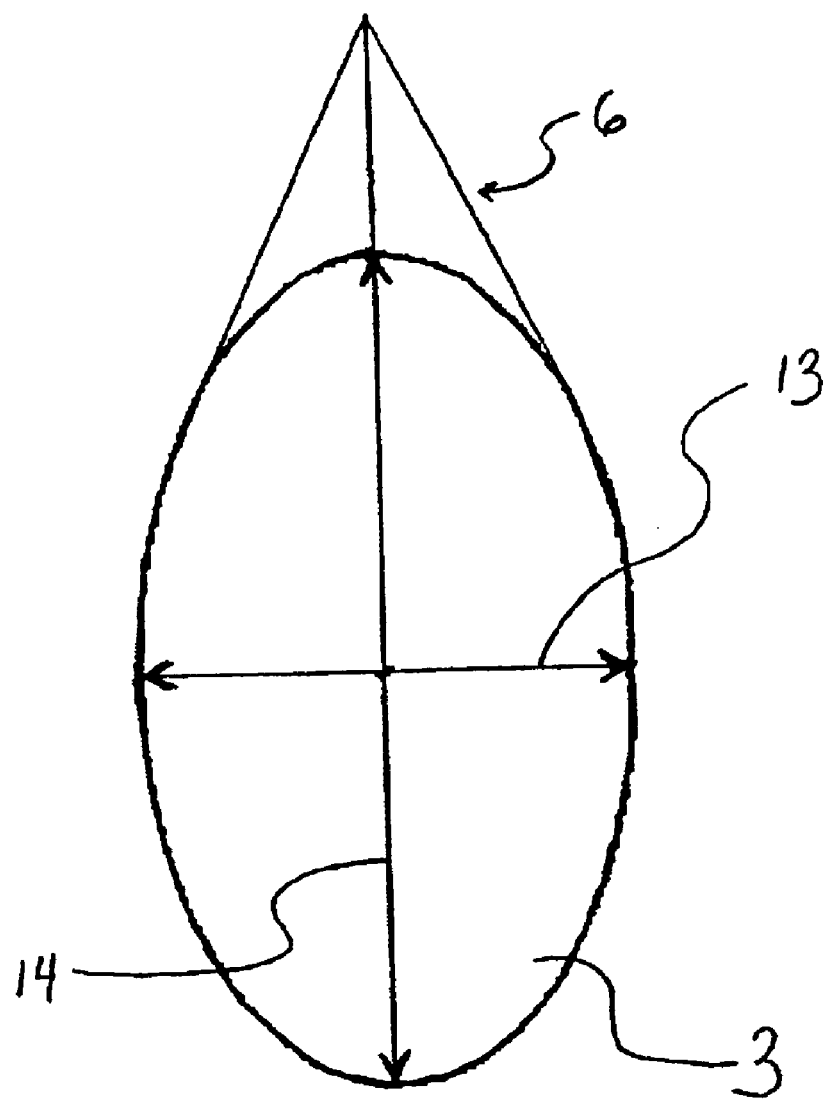
FIG. 5 is a cross-sectional view of the load supporting member of FIG. 4 taken along line V—V.

Referring now to FIG. 5, bottom support member 3 has an elliptical cross section. As a result of having elliptical cross section, bottom support member 3 has a minor thickness 13 and major thickness 14. While FIG. 5 illustrates bottom support member 3, the characteristics shown in FIG. 5 apply equally to the two side support members 2, 4. Thus, side support members 2, 4 also have elliptical cross sections and have a major thickness 14 and a minor thickness 13.

Preferably, the minor thickness 13 of bottom support member 3 and side support members 2, 4 is no more than about 0.5 inches. While it is possible that the elliptical cross sections of bottom support member 3 and side support members 2, 4 are substantially equal in size, it is preferable that bottom support member 3 have a larger minor thickness 13 and major thickness 14 than the two side support members 2, 4. This is because bottom support member 3 supports the majority of the wafer loading force.

Figure 6:
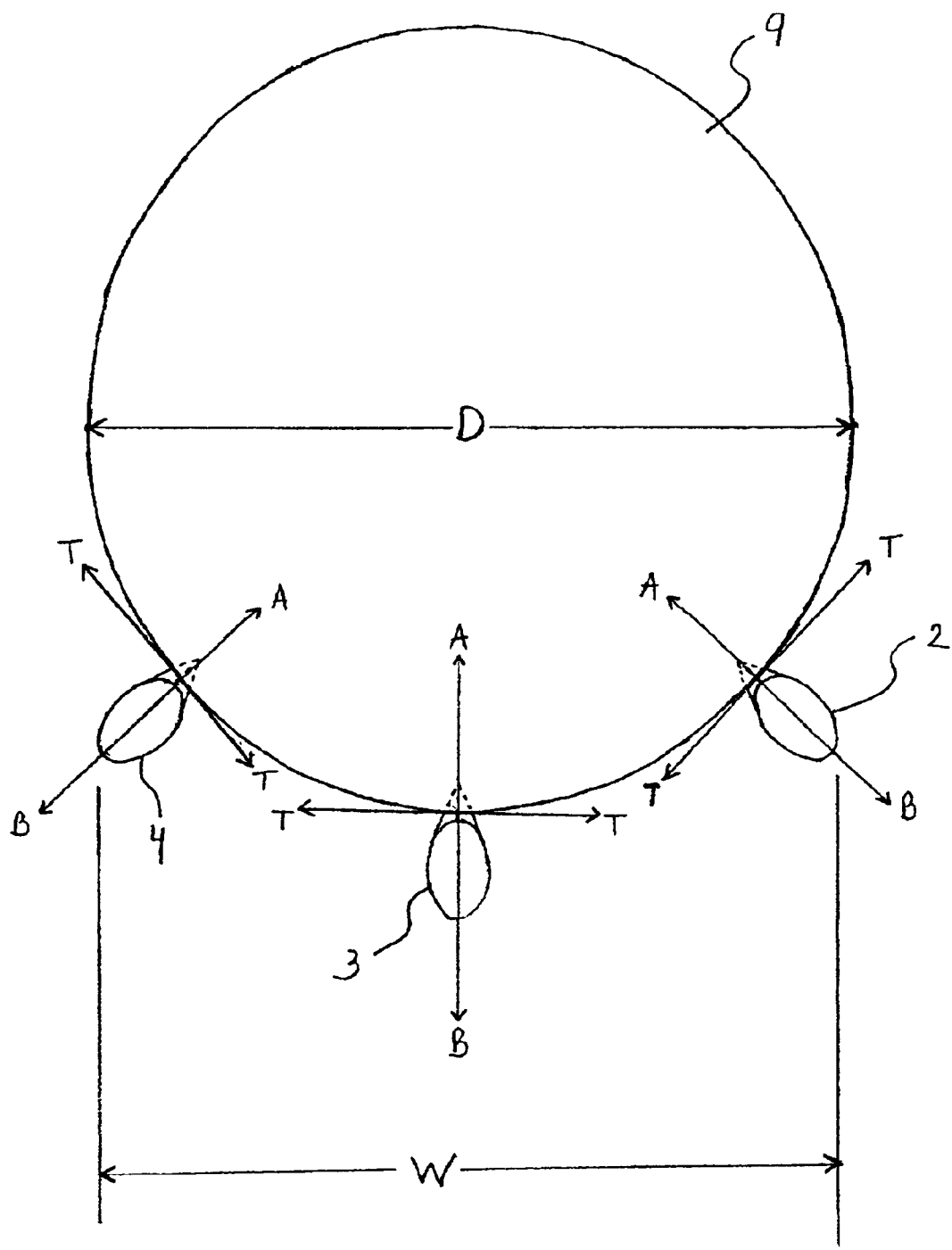
FIG. 6 is a cross-sectional view of a low profile wafer carrier supporting a wafer.

Referring to FIG. 6, when wafer 9 is placed into wafer carrier 1 (FIG. 2), bottom support member 3 and side support members 2, 4 are oriented so that their major thicknesses 14 (not shown) are aligned in the load bearing direction. In the illustrated embodiment, because wafer 9 is circular, bottom support member 3 and side support members 2, 4 are oriented so that if a line AB were extended through each of the major thicknesses 14 (FIG. 5) of bottom support member 3 and side support members 2, 4, lines AB would be substantially perpendicular to tangent lines TT drawn from the point where bottom support member 3 and side support members 2, 4 contact wafer 9 respectively.

Moreover, bottom support member 3 and side support members 2, 4 are positioned so that the width W of wafer carrier 1 is less than the diameter D of wafers 9 being supported by wafer carrier 1 (FIG. 1). The width W of wafer carrier 1 is the distance between the outermost point of the two side support members 2, 4.

Figure 7:
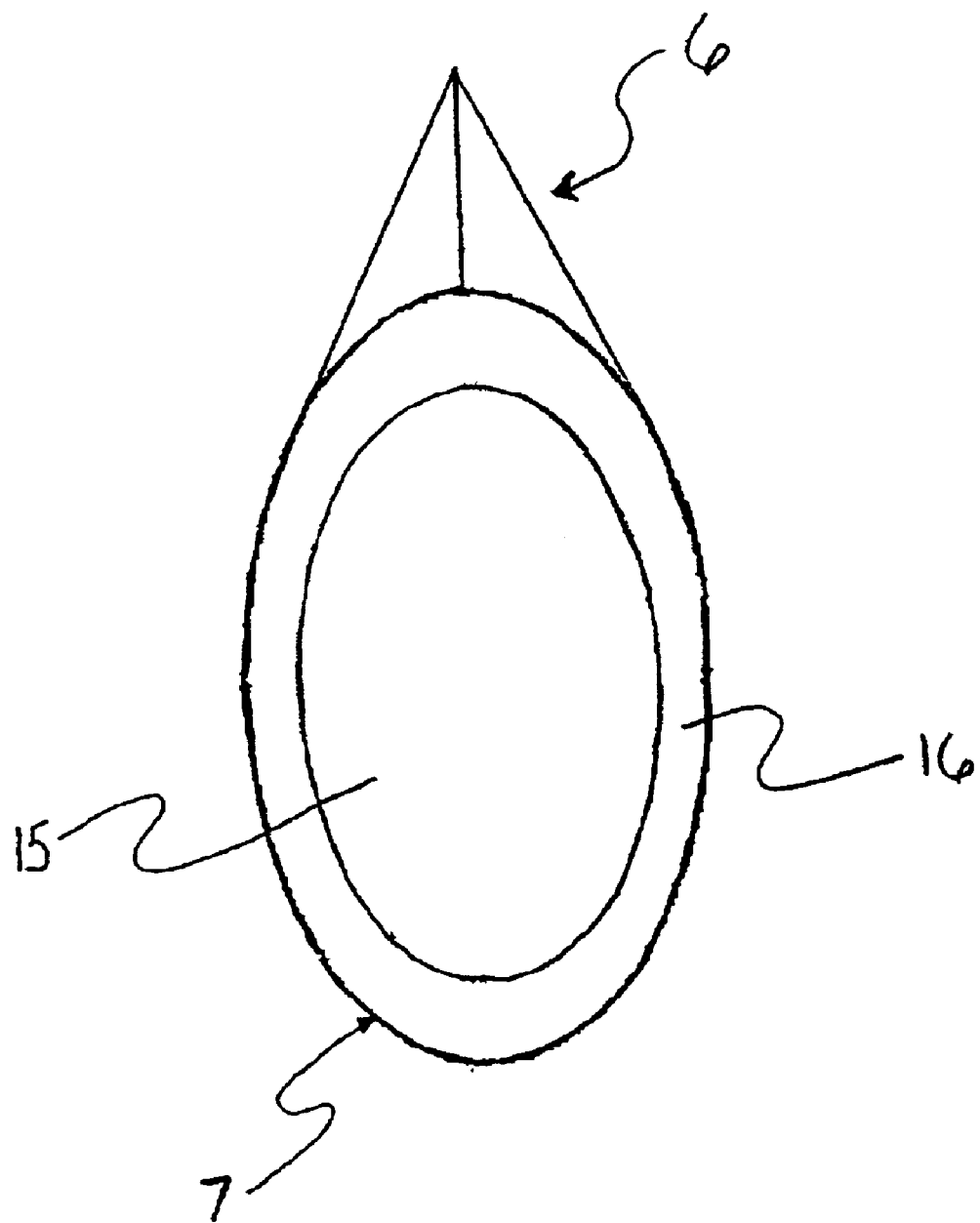
FIG. 7 is a cross-sectional view of a load supporting member constructed so as to have an inner core and an outer coating.

Referring to FIGS. 1 and 7, wafer carrier 1 must be constructed so as to be chemically resistant and adapted to withstand thermal cycling at temperatures of 1800° C. with no substantial creep deformation. In order to achieve these goals while implementing the above described dimensional aspects, wire frame 7 can be constructed of a fluoropolymer. Preferably wire frame 7 is constructed so as to have an inner core 15 covered by an outer coating 16 wherein outer coating 16 overmolds all surfaces of wafer carrier 1. Inner core 15 can be made of ceramic, polyetherketoneketones with carbon fiber, polyetheretherketones, or other comparable flouropolymers. Optionally, stainless steel can be used to construct inner core 15 or to provide additional structural support within inner core 15. Outer coating 16 can be made of a perfluoralkoxy (preferably that which is sold under the trademark Dyneon PFA 6505HP or Teflon PFA 440HP), a copolymer of ethylene and chlorotrifluoroethylene (preferably that which is sold under the trademark Halar), or other comparable flouropolymers.

Also preferably, wafer engaging elements 6 are molded into outer coating 16.

While the invention has been described and illustrated in detail, various alternatives and modifications will become readily apparent to those skilled in the art without departing from the spirit and scope of the invention.

What is claimed is:

1. A wafer carrier comprising:
   a wire frame having three load-supporting members having wafer engaging elements for supporting at least one wafer in a substantially vertical orientation; and
   the wafer carrier having a width that is smaller than the diameter of wafers being supported by the wafer carrier.

2. The wafer carrier of claim 1 wherein the wafer engaging elements are saw-toothed profiles, grooves, or slots.

3. The wafer carrier of claim 1 wherein the wafer engaging elements of the three load-supporting members arc parallelly aligned.

4. The wafer carrier of claim 1 wherein the wafer engaging elements are saw-toothed profiles having wafer contact edges.

5. The wafer carrier of claim 1 wherein the wire frame is chemically resistant and is adapted to withstand thermal cycling a temperatures of 1800° C. with no substantial creep deformation.

6. The wafer carrier of claim 5 wherein the wire frame is constructed of a fluoropolymer.

7. A method of processing wafers comprising loading wafers in the wafer carrier of claim 1; introducing the loaded wafer carrier into a process tank; treating the wafers in the carrier with a liquid; and drying the wafers.

8. A process tank which comprises the wafer carrier of claim 1.

9. The process tank of claim 8 comprising a rinsing tank, a drying tank, or a chemical treatment tank.

10. A wafer carrier comprising:
    a wire frame having three load-supporting members having wafer engaging elements; and
    wherein each load supporting member has an elliptical cross section having a major thickness and a minor thickness.

11. The wafer carrier of claim 10 wherein each load supporting member is oriented so that the major thickness of its elliptical cross section is aligned in the load bearing direction.

12. The wafer carrier of claim 10 wherein the minor thickness of each load-supporting member is no more than about 0.5 inches.

13. The wafer carrier of claim 10 wherein the three load supporting members consist of a bottom support member and two side support members.

14. The wafer carrier of claim 13 wherein the major thickness and minor thickness of the bottom support member are larger than the major thickness and minor thickness of the two side support members respectively.

15. The wafer carrier of claim 14 wherein the minor thickness of the bottom support member is no more than about 0.5 inches.

16. A wafer carrier comprising:
    a wire frame having three load-supporting members having wafer engaging elements; and
    the wire fame constructed so as to have an inner core and an outer coating;
    wherein the inner core is made of a fluoropolymer.

17. A wafer carrier comprising:
    a wire frame having three load-supporting members having wafer engaging elements; and
    the wire fame constructed so as to have an inner core and an outer coating;
    wherein the inner core is made of material selected from the group consisting of ceramic, polyetherketoneketones with carbon fiber, stainless steel, and polyetheretherketones.

18. A wafer carrier comprising:
    a wire frame having three load-supporting members having wafer engaging elements; and
    the wire fame constructed so as to have an inner core and an outer coating;
    wherein the outer coating is a fluoropolymer.

19. A wafer carrier comprising:
    a wire frame having three load-supporting members having wafer engaging elements; and
    the wire fame constructed so as to have an inner core and an outer coating;
    wherein the outer coating is either a suitable perfluoralkoxy or a copolymer of ethylene and chlorotrifluoroethylene.

20. A wafer carrier comprising:
    a wire frame having three load-supporting members having wafer engaging elements; and
    the wire frame constructed so as to have an inner core and an outer coating;
    wherein the wafer engaging elements are molded into the outer coating.

21. A wafer carrier comprising a wire frame having three load-supporting members having wafer engaging elements; wherein the wafer engaging elements of the three load supporting members are a plurality of parallelly aligned saw-toothed profiles having wafer contact edges; each load supporting member has an elliptical cross section having a major thickness and a minor thickness; each load supporting member is oriented so that the major thickness of its elliptical cross section is aligned in the load bearing direction; the three load supporting members consist of a bottom support member and a two side support members; the major thickness and minor thickness of the bottom support member ire larger than the major thickness and minor thickness of the two side support members respectively; the minor thickness of the bottom support member is no more than about 0.5 inches; the width of the wafer carrier is less than the diameter of the wafers being supported by the wafer carrier, the wafer carrier is chemically resistant and is adapted to withstand thermal cycling at temperatures of 1800° C. with no substantial creep; the wire fame is constructed so as to have an inner core and an outer coating wherein the inner core is ceramic and the outer coating is a fluoropolymer; and the saw toothed profiles are molded into the outer coating.

* * * * *